United States Patent [19]

Mitomi

[11] Patent Number: 5,053,709
[45] Date of Patent: Oct. 1, 1991

[54] METHOD AND SYSTEM FOR CONTROLLING AN RF PULSE IN A MAGNETIC RESONANCE IMAGING APPARATUS

[75] Inventor: Michio Mitomi, Ootawara, Japan

[73] Assignee: Kabushiki Kaisha Toshiba, Kawasaki, Japan

[21] Appl. No.: 357,955

[22] Filed: May 30, 1989

[30] Foreign Application Priority Data

Jun. 1, 1988 [JP] Japan ................................ 63-132819

[51] Int. Cl.⁵ .......................................... G01R 33/20
[52] U.S. Cl. .................................... 324/307; 324/309
[58] Field of Search ............... 324/307, 309, 313, 314, 324/318, 322

[56] References Cited

U.S. PATENT DOCUMENTS

| | | | |
|---|---|---|---|
| 4,528,985 | 7/1985 | Macovski | 324/309 |
| 4,694,254 | 9/1987 | Vatis et al. | 324/314 |
| 4,739,268 | 4/1988 | Fox | 324/314 |

Primary Examiner—Michael J. Tokar
Attorney, Agent, or Firm—Foley & Lardner

[57] ABSTRACT

In an MRI apparatus, the amplification factor of a high-frequency amplifier incorporated in the transmission system for generating RF pulses is automatically controlled in accordance with the input/output characteristic between the signal input to the amplifier and the signal output therefrom. Hence, the amplifier can perform a linear amplification of the input signal, regardless of the level of the input signal. Hence, the transmission system can generate RF pulses having a spectral distribution representing a predetermined intensity in only a specified frequency domain, using the signal output from the amplifiers.

6 Claims, 7 Drawing Sheets

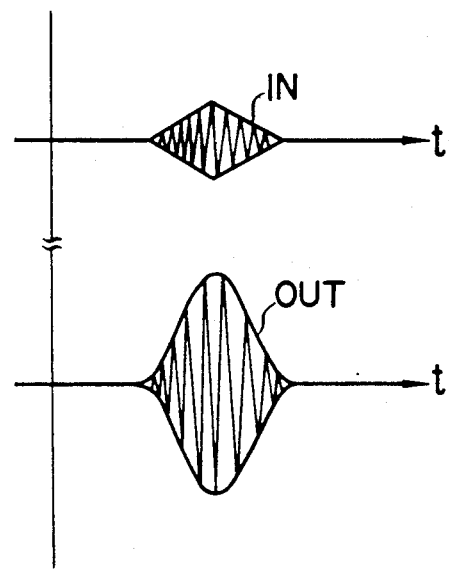
F I G. 2
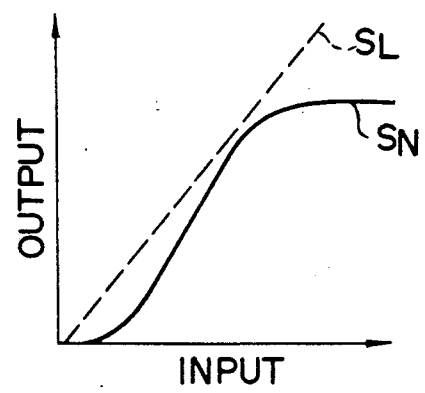
F I G. 3

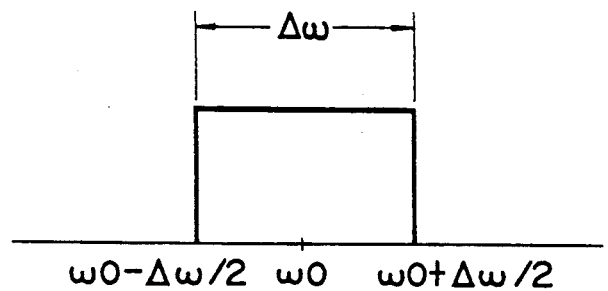
F I G. 4A
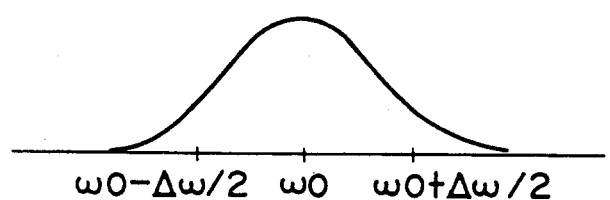
F I G. 4B

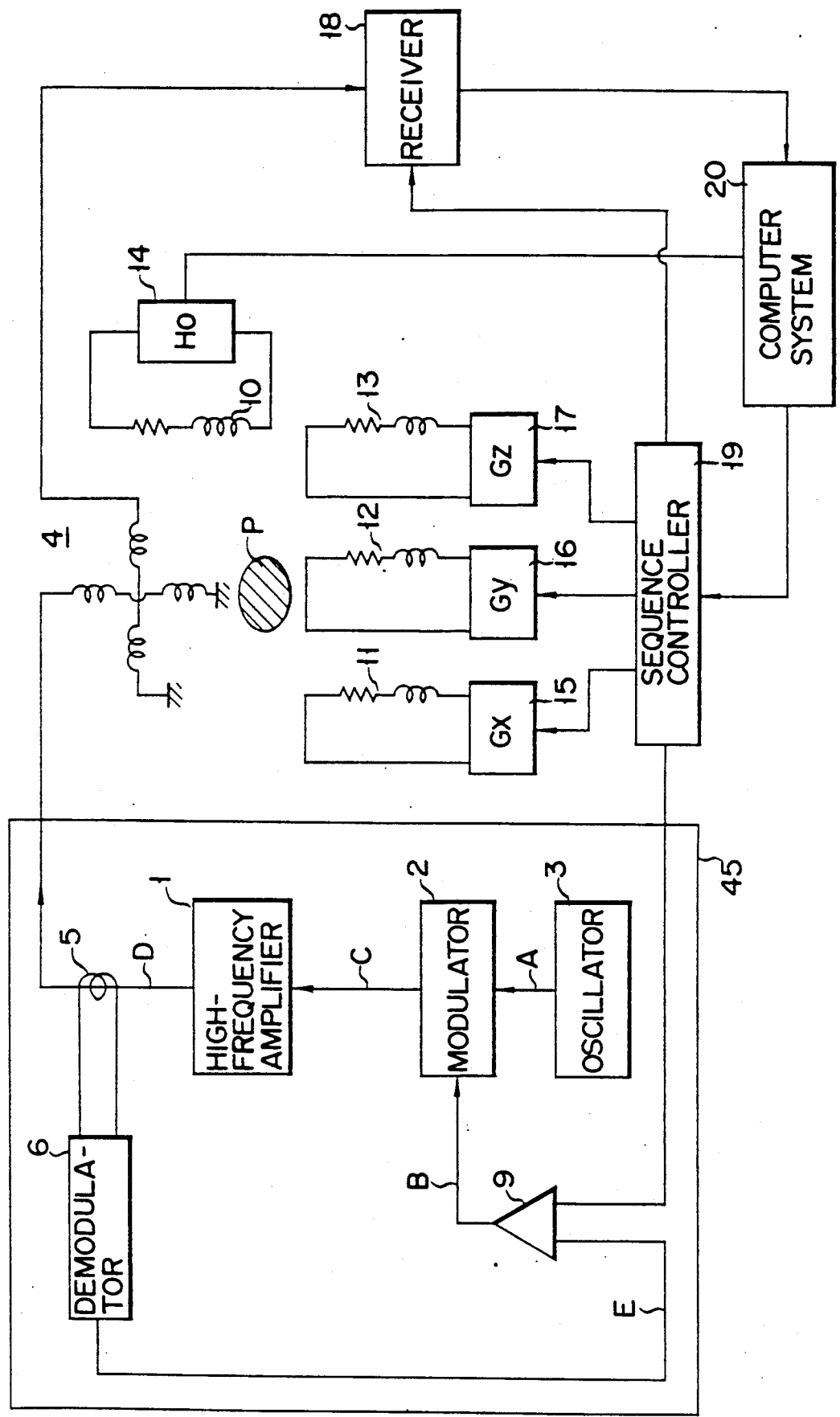
F I G. 5

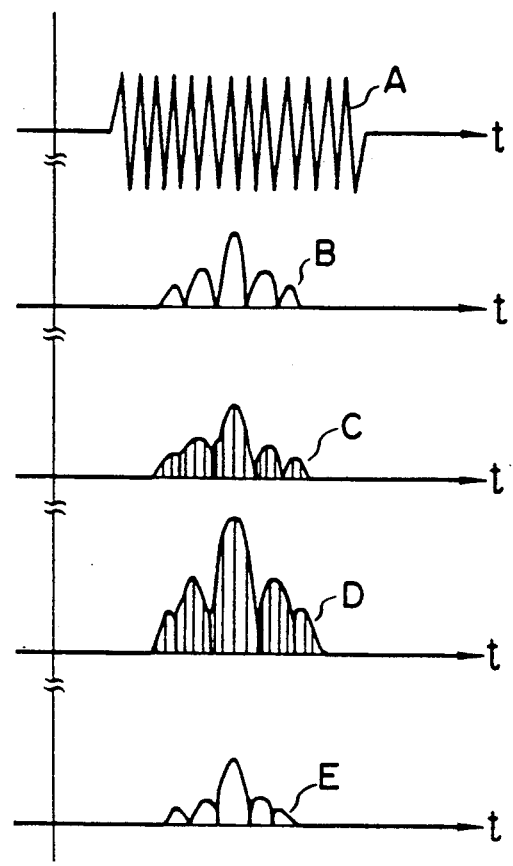
F I G. 6

METHOD AND SYSTEM FOR CONTROLLING AN RF PULSE IN A MAGNETIC RESONANCE IMAGING APPARATUS

BACKGROUND OF THE INVENTION

1. Field of the Invention

The present invention relates to a method of controlling an RF pulse in a magnetic resonance imaging apparatus and a system for practicing the method.

2. Description of the Related Art

In a magnetic resonance (MR) phenomenon, an atomic nucleus having a magnetic moment in a static field absorbs or emits an electromagnetic wave having a specific frequency by resonance. A resonance frequency (Lamor frequency) $\nu_0$ of the atomic nucleus is represented by the following equation:

$$\nu_0 = \gamma H_0/2 \qquad (1)$$

where $\gamma$ is the magnetogyric ratio unique to the type of atomic nucleus, and $H_0$ is the intensity of a static field.

An MRI (magnetic resonance imaging) apparatus for diagnosing the inside of a subject to be examined by utilizing the MR phenomenon applies a slicing gradient field and an RF (radio frequency) pulse to the subject placed in a uniform static field. A nuclide of interest in the subject is selectively excited to generate an MR signal. In order to add position information to the MR signal, a phase encoding gradient field is applied in a direction perpendicular to the directions of the slicing and phase encoding gradient fields. The MR signal generated in the subject is received by an RF coil and is subjected to image processing, thereby displaying an MR image.

In a transmission system of an MRI apparatus shown in FIG. 1, an oscillator 51 generates a high-frequency signal having a frequency corresponding to the Lamor frequency of a nuclide of interest. A modulator 52 modulates the high-frequency signal output from the oscillator 51 by using a modulation signal based on a pulse sequence. An amplifier 53 amplifies the high-frequency signal modulated by the modulator 52 up to about 1 to 15 kW. The amplified high-frequency signal is applied as an RF pulse by an RF coil 54 to a subject to be examined.

In the transmission system having the above-described arrangement, the slice profile of an MR slice image is determined by the input/output characteristics of the amplifier 53. Input and output signals to/from the amplifier 53 may exhibit waveforms shown in, e.g., FIG. 2 depending on a variation in components of the amplifier 53. In FIG. 2, reference symbol IN denotes an input signal; and OUT, an output signal. That is, as shown in FIG. 3, although a linear input/output characteristic curve $S_L$ is preferably obtained, a nonlinear input/output characteristic curve $S_N$ is obtained in practice.

A general amplifier can perform substantially linear amplification with a predetermined amplification factor when an input signal has a low level. However, when an input signal has a high level, since the amplification factor is decreased, linear amplification cannot be performed. In a conventional MRI apparatus, however, proper countermeasures against a nonlinear amplification or occurrence of distortion of an output signal in a high-frequency amplifier have not been taken.

When an RF pulse is generated by supplying a distorted current to an RF coil, the RF pulse excites not only a nuclide of interest in a selective excitation portion in a subject to be examined but also nuclides in other portions. Since signals from other portions are thus included in a detected MR signal, an MR image having high resolution cannot be reconstructed.

FIG. 4A shows the spectrum distribution of an RF pulse obtained by ideal linear amplification using a high-frequency amplifier. In FIG. 4A, a spectrum width $\Delta\omega$ corresponds to the thickness of a portion to be excited. If linear amplification is not performed in a high-frequency amplifier, the spectrum of an obtained RF pulse exhibits a spectrum distribution shown in, e.g., FIG. 4B. As described, therefore, in this case, not only a selected excitation portion of a subject to be examined but also an adjacent portion are excited. For this reason, in a multi-slice operation, gaps are generated between the respective slices.

A strong demand, therefore, has arisen for an MRI apparatus having a high-frequency amplifier capable of generating an RF pulse without distortion.

SUMMARY OF THE INVENTION

It is an object of the present invention to provide a method of controlling an RF pulse in an MRI apparatus and a system for practicing the method.

According to one aspect of the present invention, there is provided a system for controlling an RF pulse applied to a subject in a magnetic resonance imaging apparatus, the system comprising:

generating means for generating an RF signal having a frequency corresponding to a resonance frequency of a nucleus within the subject in a magnetic field;

modulating means for modulating the generated RF signal to generate an RF pulse having a predetermined frequency spectrum for slicing a portion of the subject;

amplifying means for amplifying the modulated RF signal;

detecting means for detecting the amplified RF signal; and controlling means for controlling an amplification factor of the amplifying means in accordance with the detected RF signal and the generated RF signal to linearly amplify the modulated RF signal.

According to another aspect of the present invention, there is provided a method for controlling an RF pulse applied to a subject in a magnetic resonance imaging apparatus, the method comprising the steps of:

generating an RF signal having a frequency corresponding to a resonance frequency of a nucleus within a subject in a magnetic field;

modulating the generated RF signal to generate an RF pulse having a predetermined frequency spectrum for slicing a portion of the subject;

amplifying the modulated RF signal;

detecting the amplified RF signal; and controlling an amplification factor in accordance with the detected RF signal and the generated RF signal to linearly amplify the modulated RF signal.

BRIEF DESCRIPTION OF THE DRAWINGS

FIG. 2 shows waveforms of input and output signals in an amplifier;

FIG. 3 is a graph showing input/output characteristics of the amplifier;

FIGS. 4A and 4B show spectrum distributions of RF pulses for linear amplification and nonlinear amplification in the amplifier;

FIG. 5 is a block diagram showing an arrangement of an MRI system according to a first embodiment of the present invention;

FIG. 6 shows output signal waveforms in the respective sections of a transmission system in FIG. 5;

DETAILED DESCRIPTION OF THE PREFERRED EMBODIMENTS

Figure 1:
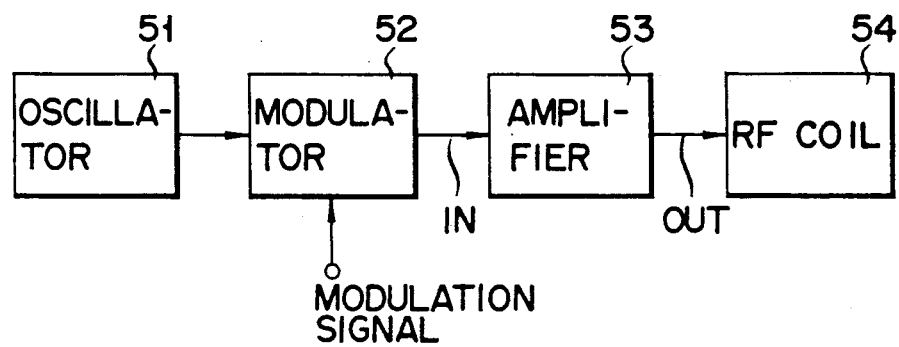
FIG. 1 is a block diagram showing an arrangement of a conventional transmission system.

Embodiments of the present invention will be described below with reference to the accompanying drawings.

Referring to FIG. 5, a system according to a first embodiment comprises a static field coil 10 for generating a static field Ho, coils 11, 12, and 13 for respectively generating X-, Y-, and Z-axis gradient fields Gx, Gy, and Gz, an RF coil 4 for transmitting an RF pulse and detecting an MR signal from a subject P, a static field power supply 14 for supplying a current to the static field coil 10, gradient field power supplies 15, 16, and 17 for respectively supplying currents to the gradient field coils 11, 12, and 13, a receiver 18, a sequence controller 19 for executing a pulse sequence, a computer system 20 for performing image processing based on an MR signal and performing a display or the like of the processing result, and a transmission system 45.

The transmission system 45 comprises a high-frequency amplifier 1, a modulator 2, an oscillator 3, a current detector 5, a demodulator 6, and a differential amplifier 9.

The oscillator 3 generates a high-frequency signal having a frequency corresponding to the Lamor frequency of an atomic nucleus to be excited. When, for example, proton imaging is to be performed in a static field Ho having an intensity of 0.5 T (tesla), a high-frequency signal of 21.3 MHz is generated. The modulator 2 modulates the high-frequency signal from the oscillator 3 in accordance with a modulation signal from the differential amplifier 9. The modulated high-frequency signal has a predetermined spectrum distribution for selective excitation. The high-frequency amplifier 1 amplifies the modulated high-frequency signal. The amplified high-frequency signal is applied as an RF pulse from the RF coil 4 to the subject P.

The current detector 5 constituted by a current transformer or the like detects the signal amplified by the high-frequency amplifier 1. The demodulator 6 demodulates the signal detected by the current detector 5. The differential amplifier 9 obtains the difference between the signal demodulated by the demodulator 6 and a modulation signal from the sequence controller 19, and outputs a modulation signal based on the difference to the modulator 2.

An operation of the system according to the first embodiment will be described below.

As shown in FIG. 5, the subject P is placed in the static field Ho, and the transmission system 45 is driven in accordance with a pulse sequence by the sequence controller 19. In the transmission system 45, a high-frequency signal from the oscillator 3 is modulated by the modulator 2 in accordance with a modulation signal from the differential amplifier 9, and is amplified by the high-frequency amplifier 1. Thereafter, the amplified signal is applied as an RF pulse from the RF coil 4 to the subject P. Note that waveforms A to E shown in FIG. 6 respectively correspond to outputs from the oscillator 3, the differential amplifier 9, the modulator 2, the high-frequency amplifier 1, and the demodulator 6. When the gradient field power supplies 15, 16, and 17 are driven in accordance with a pulse sequence by the sequence controller 19, slicing, phase encoding, and read gradient fields are respectively applied from the gradient fields coils 11, 12, and 13 to the subject P.

Consequently, an MR phenomenon occurs, and an MR signal from the subject P is detected by the RF coil 4. The computer system 20 performs image reconstruction processing based on the detected MR signal and displays an MR image or the like.

Since the transmission system 45 is operated to compensate for the input/output characteristics of the high-frequency amplifier 1, and RF pulse having no distortion can be generated, and an MR image with high resolution can be obtained.

Figure 7:
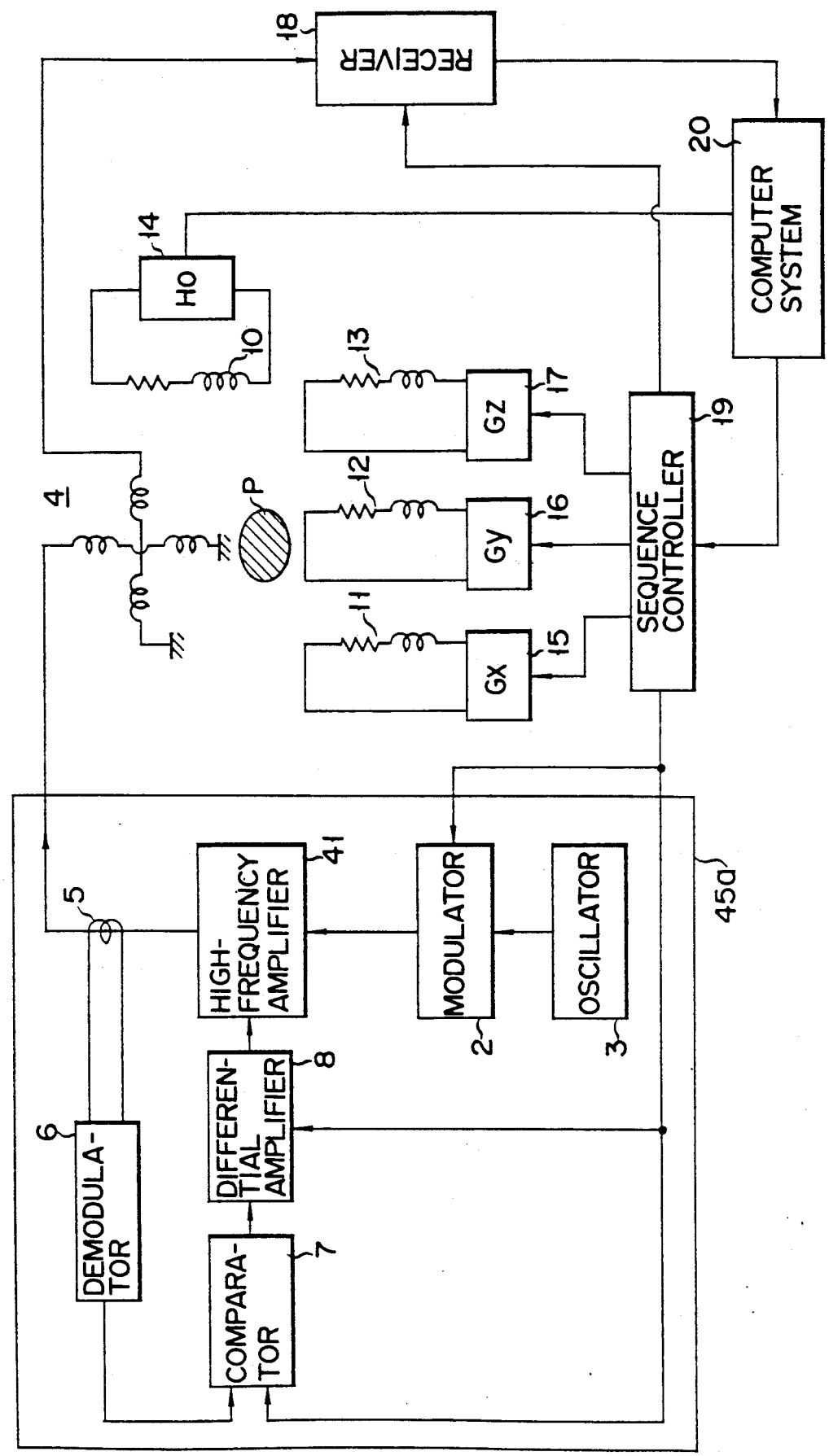
FIG. 7 is a block diagram showing an arrangement of a system according to a second embodiment of the present invention.

FIG. 7 shows an arrangement of a system according to a second embodiment of the present invention. This system is different from the system of the first embodiment shown in FIG. 5 in that an output signal from a differential amplifier 8 of a transmission system 45a is input to a high-frequency amplifier 41. Note that the transmission system 45a comprises a comparator 7.

Referring to FIG. 7, the comparator 7 compares a signal output from a demodulator 6 with a modulation signal output from a sequence controller 19, and generates a differential signal representing the difference between the signals. The differential signal generated by the comparator 7 is amplified by the differential amplifier 8 and is output to the high-frequency amplifier 41.

Figure 8:
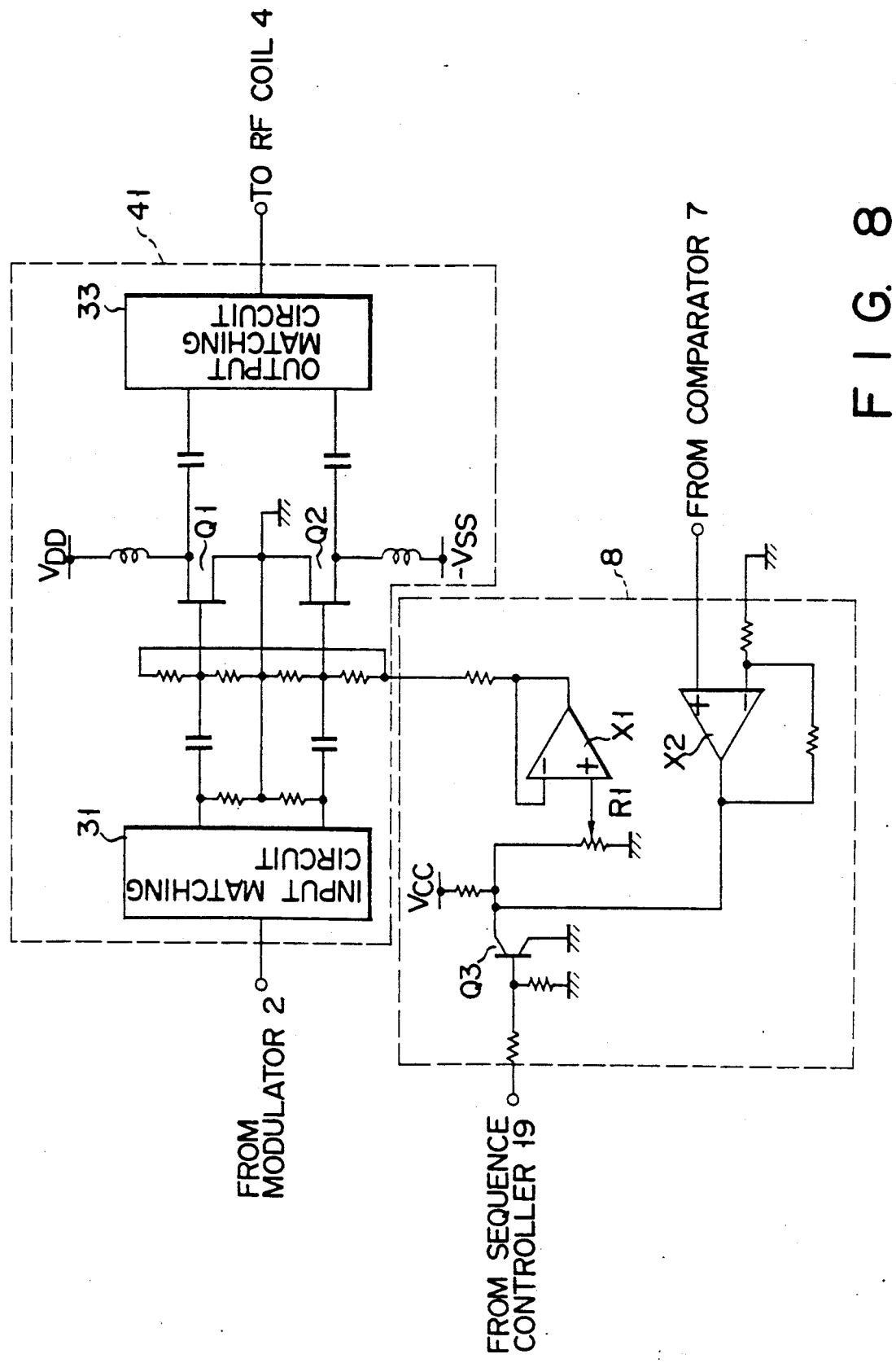
FIG. 8 is a block diagram showing a circuit arrangement of a high-frequency amplifier and a differential amplifier in the system shown in FIG. 7.

FIG. 8 shows a circuit arrangement of the high-frequency amplifier 41 and the differential amplifier 8 shown in FIG. 7. The amplifier 41 comprises power amplifying FETs Q1 and Q2, an input matching circuit 31, and an output matching circuit 33. The amplifier 8 comprises a transistor Q3 and operational amplifiers X1 and X2.

An output signal from the modulator 2 is supplied to the input matching circuit 31 to perform matching of an input impedance. An output signal from the input matching circuit 31 is supplied through a CR circuit to a push-pull power amplifying circuit constituted by the FETs Q1 and Q2. The biases of the FETs Q1 and Q2 are controlled by an output signal from the differential amplifier 8, as will be described later.

The output signal from the comparator 7 is amplified by the operational amplifier X2 and is divided by a variable resistor R1. Thereafter, the divided signal is supplied to a constant current circuit constituted by the operational amplifier X1. Note that an output current from the operational amplifier X1 represents the magnitude of distortion in the high-frequency amplifier 41 and is proportional to a voltage divided by the variable resistor R1.

A signal obtained by superposing the output signal from the input matching circuit 31 on a bias signal (voltage) corresponding to the output current from the operational amplifier X1 is supplied to the gate of each of the FETs Q1 and Q2. In this case, the absolute value of an output signal obtained by ideal linear amplification is subtracted from the absolute value of an actual output signal from the high-frequency amplifier 41. A bias voltage having the polarity corresponding to the sign of the obtained difference is applied to the gate of each of the FETs Q1 and Q2. For example, if the sign of the subtraction value is negative, i.e., the distortion is negative, a bias voltage having a polarity for reducing the biases of the FETs Q1 and Q2 is applied to the gates of the FETs Q1 and Q2. As a result, the amplification factors of the FETs Q1 and Q2 are increased to reduce the distortion.

By adjusting the biases of FETs Q1 and Q2 constituting the power amplifying circuit, the amplification factors can be changed. Since the distortion can be reduced with this adjustment, linear amplification can be performed regardless of the level of a signal input to the high-frequency amplifier 41. Bias adjustment in the high-frequency amplifier 41 is performed by on/off-controlling the transistor Q3 by using a pulse signal output from the sequence controller 19 in synchronism with an RF signal input to the input matching circuit 31. This pulse signal has a pulse width corresponding to that of the RF signal and is input to the base of the transistor Q3.

When no RF signal is input to the input matching circuit 31, the transistor Q3 is set in an on state, and a bias voltage to the FETs Q1 and Q2 becomes zero. Therefore, unnecessary power losses in the FETs Q1 and Q2 can be prevented, and moreover, superposition of noise on an RF pulse can be prevented.

When an RF signal is input to the input matching circuit 31, the transistor Q3 is set in an off state, and bias adjustment for the FETs Q1 and Q2 is performed.

Figure 9:
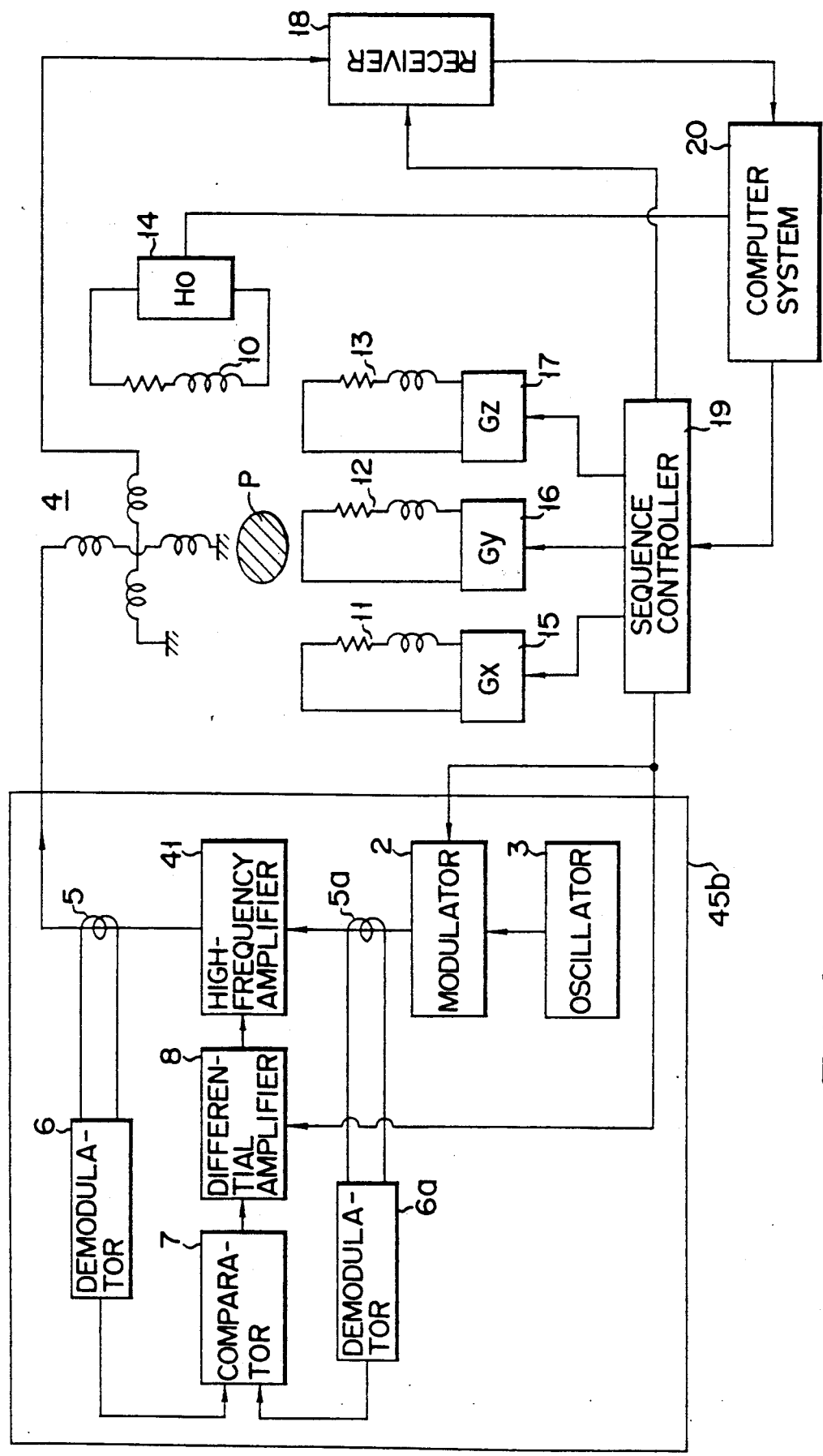
FIG. 9 is a block diagram showing an arrangement of a system according to a third embodiment of the present invention.

FIG. 9 shows an arrangement of a system according to a third embodiment of the present invention. This system is different from the system of the second embodiment shown in FIG. 7 in that a transmission system 45b comprises a current detector 5a for detecting a signal input to a high-frequency amplifier 41 and a demodulator 6a for demodulating the signal detected by the current detector 5a. An output signal from the demodulator 6a is supplied to a comparator 7 to be compared with an output signal from a demodulator 6. Linear amplification without distortion can be also performed by such an arrangement.

As has been described above, the high-frequency amplifiers in the transmission systems of the embodiments can perform linear amplification without distortion regardless of the level of an RF signal. An RF pulse generated by the RF coil using an amplified RF signal has a spectrum distribution representing a predetermined intensity in a predetermined frequency domain and a zero intensity in other frequency domains. When a nuclide of interest in a subject to be examined is selectively excited by such an RF signal, the boundary between a portion including the nuclide to be excited and a portion including a nuclide not to be excited becomes distinctive. If the RF pulse is a 90 degree pulse, the macroscopic direction of magnetization in a portion to be excited is accurately inclined at 90 degrees with respect to the direction of the static field. Therefore, if image reconstruction processing is performed on the basis of an MR signal detected by applying such an RF pulse to a subject to be examined, an MR image having high resolution can be obtained.

The embodiments of the present invention have been described so far. However, the present invention is not limited to the above-described embodiments. Various changes and modifications can be made within the spirit and scope of the invention.

What is claimed is:

1. A system for controlling an RF (radio frequency) signal used to produce an RF pulse applied to a subject by an RF coil in a magnetic resonance imaging apparatus, the system comprising:
   a sequence controller;
   generating means for generating the RF signal at a frequency corresponding to a resonance frequency of a nucleus within the subject in a magnetic field;
   modulating means for modulating the generated RF signal in accordance with a control signal from the sequence controller to produce the RF pulse with a predetermined frequency spectrum for slicing a portion of the subject;
   amplifying means for amplifying the modulated RF signal and for supplying the RF pulse to the RF coil;
   demodulating means for demodulating the amplified RF signal to produce a demodulated RF signal; and
   controlling means for controlling an amplification factor of the amplifying means in accordance with the demodulated RF signal and the control signal, continuously in real time, to linearly amplify the modulated RF signal.

2. A system according to claim 1, wherein the controlling means includes means for comparing the demodulated RF signal with the control signal.

3. A method for controlling an RF (radio frequency) signal to produce an RF pulse applied to a subject by an RF coil in a magnetic resonance imaging apparatus, the method comprising the steps of:
   generating the RF signal at a frequency corresponding to a resonance frequency of a nucleus within the subject in a magnetic field;
   modulating the generated RF signal in accordance with a control signal to produce the RF pulse with a predetermined frequency spectrum for slicing a portion of the subject;
   amplifying the modulated RF signal and supplying the RF pulse to the RF coil;
   demodulating the amplified RF signal to produce a demodulated RF signal; and
   controlling an amplification factor in accordance with the demodulated RF signal and the control signal, continuously in real time, to linearly amplify the modulated RF signal.

4. A method according to claim 3, wherein the controlling step includes the step of comparing the demodulated RF signal with the control signal.

5. A system according to claim 2, wherein the amplification factor of the amplifying means is controlled in accordance with a difference between the control signal and the demodulated RF signal.

6. A method according to claim 4, wherein the amplification factor is controlled in accordance with a difference between the control signal and the demodulated RF signal.

* * * * *